United States Patent
Cheng et al.

(10) Patent No.: US 8,422,209 B2
(45) Date of Patent: Apr. 16, 2013

(54) ELECTRONIC DEVICE INCLUDING BATTERY AND LOCKING MECHANISM FOR LOCKING THE BATTERY TO THE ELECTRONIC DEVICE

(75) Inventors: Kai-Teng Cheng, New Taipei (TW);
Wen-Chieh Tai, New Taipei (TW);
Wu-Chen Lee, New Taipei (TW);
Ker-We Lin, New Taipei (TW);
Tsan-Sheng Chen, New Taipei (TW);
Hsueh-Chih Peng, New Taipei (TW)

(73) Assignee: Acer Incorporated, New Taipei (TW)

( * ) Notice: Subject to any disclaimer, the term of this patent is extended or adjusted under 35 U.S.C. 154(b) by 229 days.

(21) Appl. No.: 13/075,230

(22) Filed: Mar. 30, 2011

(65) Prior Publication Data
US 2012/0099252 A1    Apr. 26, 2012

(30) Foreign Application Priority Data
Oct. 21, 2010  (TW) .............................. 99135954 A (51) Int. Cl.
*H05K 5/00*      (2006.01)
*H05K 7/00*      (2006.01)
*H04M 1/00*      (2006.01)

(52) U.S. Cl.
USPC ............ 361/679.01; 361/679.02; 361/679.03; 361/679.41; 361/679.43; 361/679.57; 361/679.58; 455/575.1; 455/575.3; 455/575.4

(58) Field of Classification Search ............. 361/679.01, 361/679.02, 679.08, 679.09, 679.3, 679.55–679.59, 361/679.41–679.45; 455/575.1, 575.3, 575.4, 455/575.8
See application file for complete search history.

(56) References Cited

U.S. PATENT DOCUMENTS

| | | | |
|---|---|---|---|
| 5,716,730 A | 2/1998 | Deguchi | 429/97 |
| 6,051,334 A | 4/2000 | Tsurumaru et al. | 429/97 |
| 6,302,454 B1 | 10/2001 | Tsurumaru et al. | 292/175 |
| 2007/0072485 A1 | 3/2007 | Lin et al. | 439/527 |
| 2009/0059488 A1* | 3/2009 | Minaguchi et al. | 361/679.09 |
| 2010/0165555 A1* | 7/2010 | Tobiyama et al. | 361/679.01 |

* cited by examiner

*Primary Examiner* — Jayprakash N Gandhi
*Assistant Examiner* — Jerry Wu
(74) *Attorney, Agent, or Firm* — Alan Kamrath; Kamrath IP Lawfirm, P.A.

(57) ABSTRACT

An electronic device includes a base, a locking mechanism, and a battery. The base includes a receiving bay and a battery bay. The receiving bay includes a through slot defined thereon. The battery is selectively restrained in the battery bay by the locking mechanism. The locking mechanism includes a locking member and an elastic element received in the receiving bay. The locking member is movable and includes a clutching end extending into the battery bay. The elastic element is joined to the receiving bay and the locking member. The locking member further includes an operation portion defined thereon for a user to operate the locking mechanism. The operation portion is located within the receiving bay and is exposed to outside of the receiving bay through slot. The battery includes a connecting end defined thereon for engaging with the clutching end so as to be restrained in the battery bay.

15 Claims, 13 Drawing Sheets

ELECTRONIC DEVICE INCLUDING BATTERY AND LOCKING MECHANISM FOR LOCKING THE BATTERY TO THE ELECTRONIC DEVICE

BACKGROUND OF THE INVENTION

1. Field of the Invention

The present invention relates to an electronic device including a battery and a locking mechanism for locking the battery to the electronic device and, particular to, a locking mechanism that can't be activated inadvertently to cause the battery to release from the electronic device.

2. Description of the Related Art

Because a laptop includes a battery electronically joined thereto, so the laptop can be used away from an outlet using the battery. Conventionally, a battery for each laptop is disposed within a base of the laptop and is restrained therein by a cover plate which is fastened to the base. However, fastening/unfastening the cover plate is laborious. Later, a battery is designed to be latched to a laptop. In this case, an operator merely slides a latch to allow the battery to be disengaged from the laptop which makes releasing of the battery become convenient. Furthermore, the latch is exposed and projects outwardly from the laptop but is liable to be moved inadvertently and causes the battery to disengage from the laptop, and the laptop is therefore affected by a power interruption which would damage the laptop. Additionally, if work done is not saved before the power interruption, a risk of failing to recover the work could be suffered. Therefore, in order to resolve this problem, a lock member is designed to cooperate with a battery which is fastened by a latch. The lock member is operable between a first position where the latch is unlocked and is able to be moved and a second position where the latch is locked and is unable to be moved. While the lock member prevents the latch from being moved inadvertently, an additional step is required to move the locking member for releasing the battery from the laptop. U.S. Pat. No. 6,051,334 teaches a battery latched to a laptop by a latch member and a lock member for locking the latch.

The present invention is, therefore, intended to obviate or at least alleviate the problems encountered in the prior art.

SUMMARY OF THE INVENTION

According to the present invention, an electronic device includes a base, a locking mechanism, and a battery. The base includes a receiving bay and a battery bay. The receiving bay includes an inner periphery, an outer periphery, and a through slot extending from the inner periphery to the outer periphery. The battery bay includes a periphery defining an inner periphery and an outer periphery extending from the inner periphery and the outer periphery of the receiving bay, respectively. The battery bay further includes a connecting edge defined from the periphery thereof. The connecting edge includes a joining end defined thereon. The battery is selectively restrained in the battery bay by the locking mechanism. The locking mechanism includes a locking member and an elastic element received in the receiving bay. The locking member is movable and includes a clutching end extending through the joining end into the battery bay. The elastic element is joined to the receiving bay and the locking member. The locking member further includes an operation portion defined thereon for a user to operate the locking mechanism. The operation portion is located within the receiving bay and is exposed to outside of the receiving bay through slot.

Furthermore, the battery includes a connecting end defined thereon for engaging with the clutching end so as to be restrained in the battery bay.

Furthermore, the locking mechanism is operably movable between a first operating position to fasten the battery to the electronic device and a second operating position where the battery is adapted to be disengaged from the electronic device. When the locking mechanism is in the first operating position, the connecting end of the battery is restrained by the clutching end of the locking member. When the locking mechanism is in the second operating position, the locking member moved to a position such that the connecting end of the battery is unrestrained by the clutching end of the locking member in order to be lifted off the battery bay.

Other objects, advantages, and new features of the present invention will become apparent from the following detailed description of the invention when considered in conjunction with the accompanied drawings.

DETAILED DESCRIPTION OF THE PREFERRED EMBODIMENT

Referring to the drawings, an electronic device including a battery and a locking mechanism in accordance with the present invention includes a base 10, a locking mechanism 20, a battery 30, and a display housing 40.

The base 10 includes a receiving bay 11 and a battery bay 12. The receiving bay 11 includes an opening for allowing insertion of objects that are to be disposed on the receiving bay 11. The objects at least include a system board, a processor, and a hard drive. Furthermore, the receiving bay 11 includes an inner periphery 111, an outer periphery 112, and a through slot 113 extending from the inner periphery 111 to the outer periphery 112. The receiving bay 11 further includes two engaging members 114 as well as a joint 115 extending from the inner periphery 111. Each engaging member 114 includes an inner thread formed thereon. The joint 115 is in the form of a ring. The battery bay 12 includes an opening for allowing insertion the battery 30 and the battery 30 is restrained in the battery bay 12 when it is engaged with the electronic device. Furthermore, the battery bay 12 and the battery 30 are of complement shapes to each other and the battery 30 restrained in the battery bay 12 includes an outer periphery flush with the outer periphery 112 of the receiving bay 11. Moreover, the battery bay 12 includes a periphery defining an inner periphery 121 and an outer periphery 122 and the inner and outer peripheries 121 and 122 extend from the inner and outer peripheries 111 and 112 of the receiving bay 11, respectively. A connecting edge 123 is defined from the periphery of the battery bay 12 and protrudes in an upward direction from the receiving bay 11. Further, two joining ends 124 are defined on the connecting edge 123 and each includes two opposing first end walls 1241, two opposing second end walls 1242 each extending from one first end wall 1241 to the other first end wall 1241, and a through hole 1243 delimited by the two first end walls 1241 as well as the two second end walls 1242.

The locking mechanism 20 is operably movable between a first operating position to fasten the battery 30 to the electronic device and a second operating position where the battery 30 is adapted to be disengaged from the electronic device. Moreover, the locking mechanism 20 includes a locking member 21 and an elastic element 22. The locking member 21 and the elastic element 22 are received in the receiving bay 11 of the base 10. Furthermore, the locking member 21 is movable and includes a first engaging edge 211 mounted on the inner periphery 111 of the receiving bay 11 and a second engaging edge 212 protruding in an upward direction from the first engaging edge 211. In addition, the first engaging edge 211 includes two grooves 2111 extending therethrough, and the two engaging members 114 disposed to insert through the two grooves 2111, respectively. Namely, each engaging member 14 has a cross-sectional size smaller than a width of the related groove 2111 so as to extend through the groove 2111. Likewise, the two grooves 2111 are parallel to each other in that each groove 2111 extends longitudinally in the same direction. In the preferred embodiment, the two grooves 2111 are not disposed coaxially. Further, two fasteners 2112 each includes a head with a cross sectional size greater than the width of any groove(s) 2111 are engaged with two engaging members 114, respectively, for restraining the locking member 21 from disengagement from the base 10. Each fastener 2112 includes an outer thread formed thereon. In this regard, the engaging members 114 and the fasteners 2112 are in thread engagement. The first engaging edge 211 further includes a joint 2113 in the form of a slit extending through the first engaging edge 211. The joint 2113 and the joint 115 are cooperated to hold the elastic element 22. Namely, the elastic element 22 has two distal ends 221, with one distal end 221 hooked to the joint 115 and the other distal end 221 hooked to the joint 2113. Additionally, a cutout 2114 is defined in the first engaging edge 211 and extends therethrough. The cutout 2114 includes the joint 115 extending therethrough, that is, the joint 115 will not interfere with the structure of the locking member 21. Likewise, the cutout 2114 receives the elastic element 22 and does not interfere it. As a result, the elastic element 22 will not interfere with the structure of the locking member 21. Specifically, the elastic element 22 extends longitudinally in a direction the same as a longitudinal length direction of the cutout 2114. Furthermore, the cutout 2114 is disposed adjacent and parallel to one of the two grooves 2111. The first engaging edge 211 yet further includes an operation portion 2115 defined thereon for a user to operate the locking mechanism 20. The operation portion 2115 is located within the receiving bay 11 and is exposed to outside of the receiving bay 11 through slot 113. Also, the operation portion 2115 is in the form of a recess. Further, a reinforcing structure 2116 is defined on the first engaging edge 211. The reinforcing structure 2116 is in the form of a protrusion. In addition, the reinforcing structure 2116 includes the operation portion 2115 defined therein.

Furthermore, the second engaging edge 212 of the locking member 21 includes two clutching ends 2121 defined thereon and extending through the two joining ends 124, respectively. Namely, each clutching end 2121 extends through the joining end 124 through the related through hole 1243. In other words, each clutching end 2121 has a cross-sectional size smaller than a cross-sectional size of the relegated through hole 1243 so as to extend therethrough. In addition, each clutching end 2121 of the locking member 21 is movable in the related through hole 1243 upon the operational movement of the locking mechanism 20. Moreover, each clutching end 2121 is in the form of a protrusion and is partially received in the battery bay 12.

Figure 1:
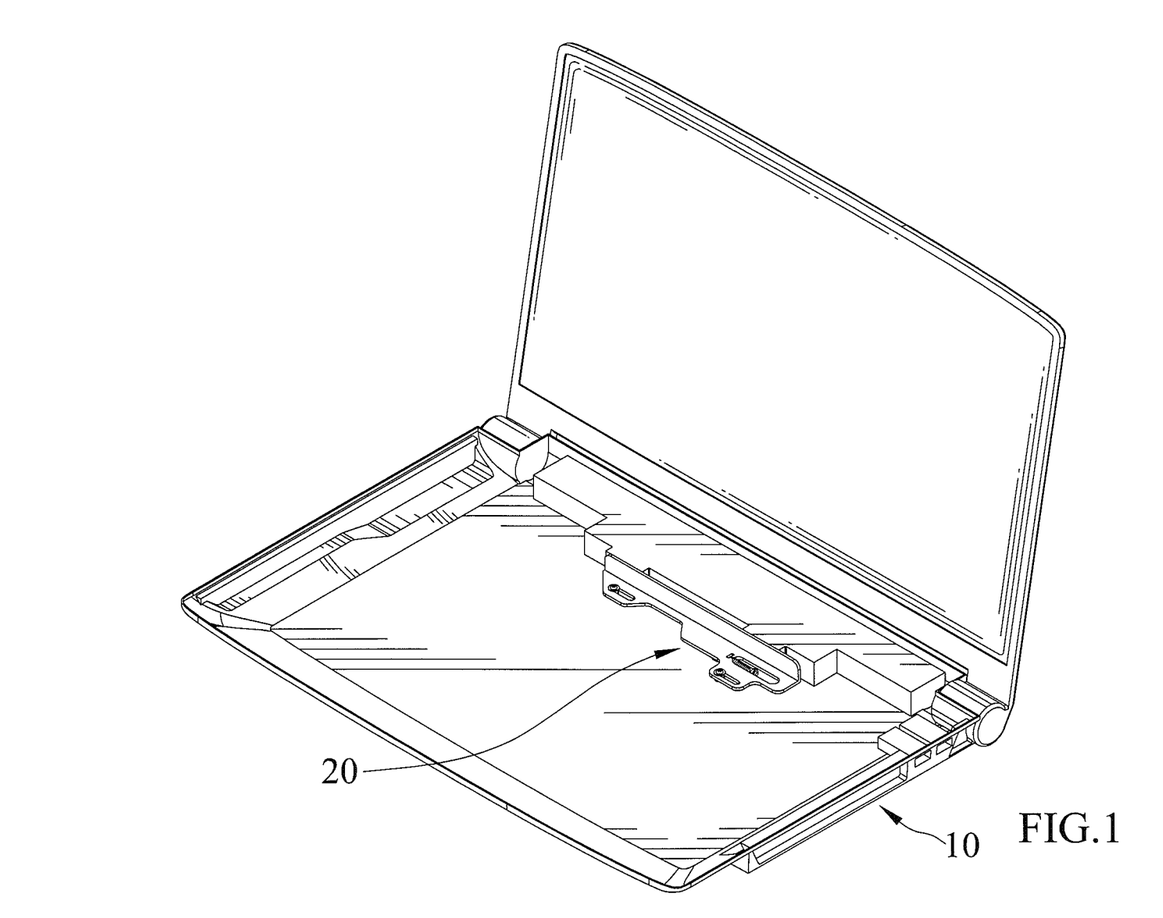
FIG. 1 is a perspective view of an electronic device including a battery and a locking mechanism in accordance with the present invention.
Figure 2:
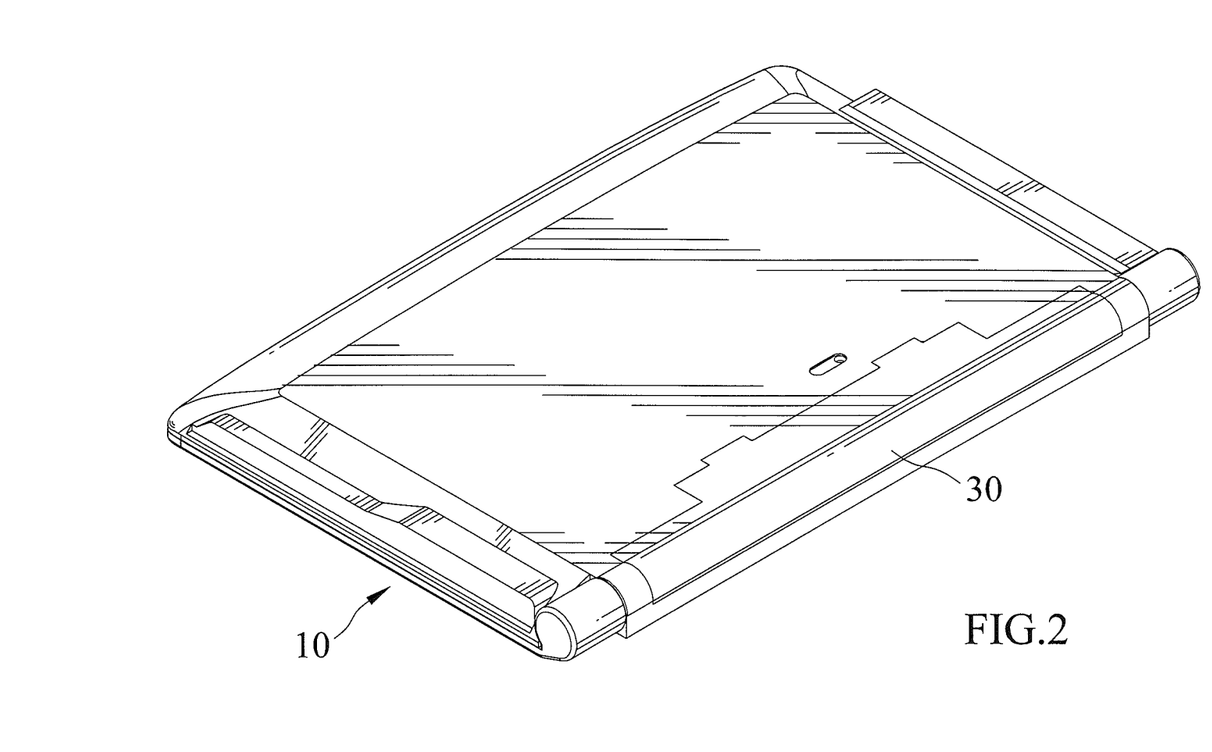
FIG. 2 is another perspective view of the electronic device including the battery and the locking mechanism.
Figure 3:
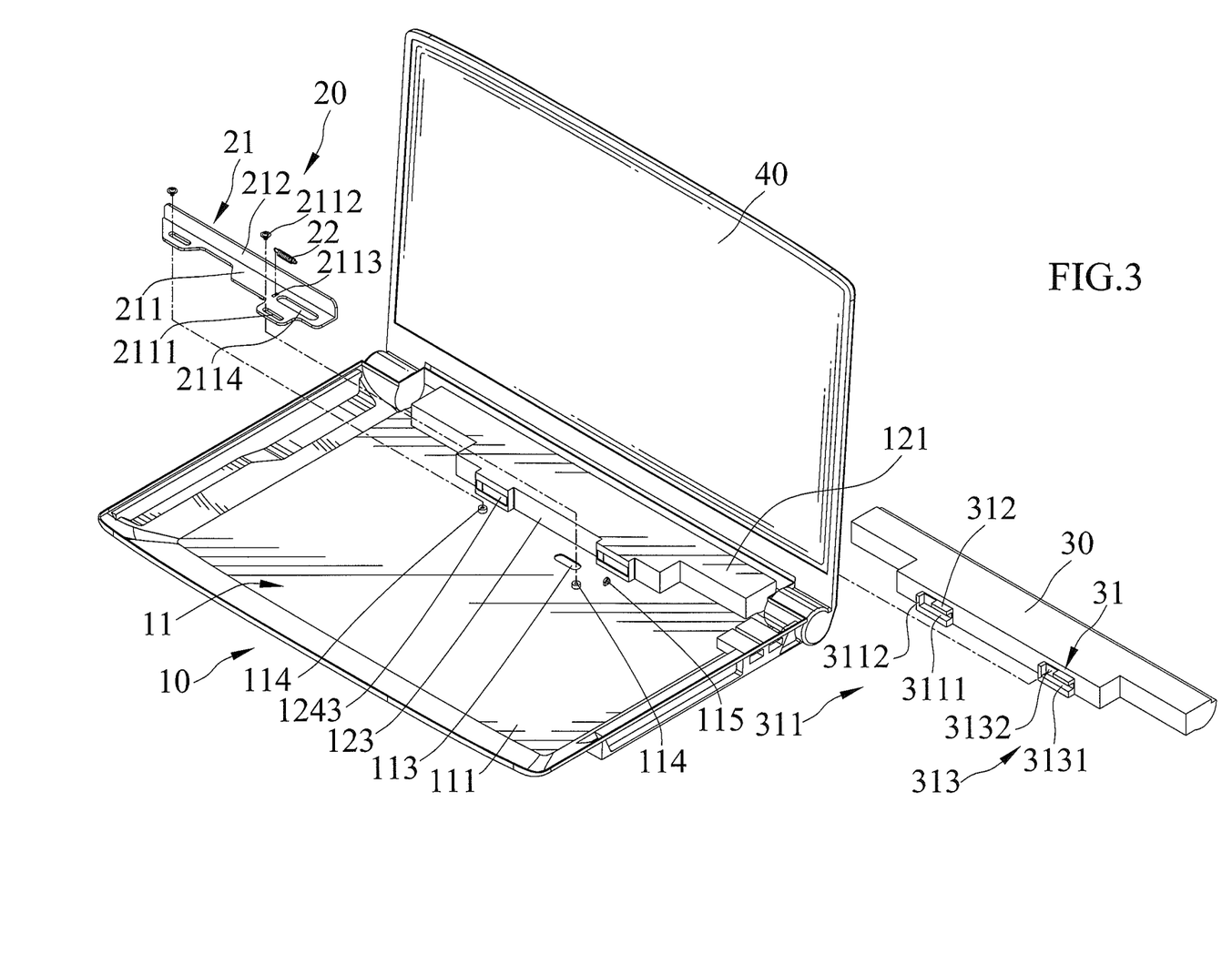
FIG. 3 is an exploded perspective view of the electronic device including the battery and the locking mechanism.
Figure 4:
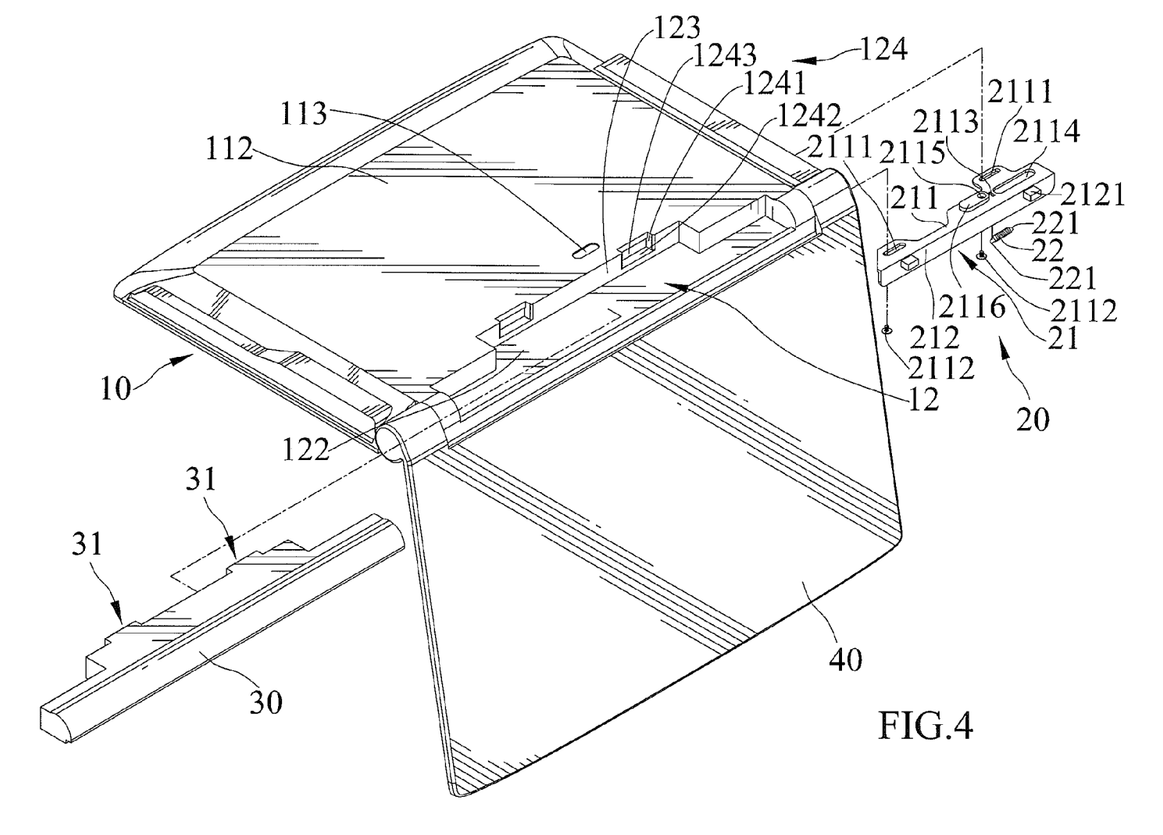
FIG. 4 is another exploded perspective view of the electronic device including the battery and the locking mechanism.
Figure 5:
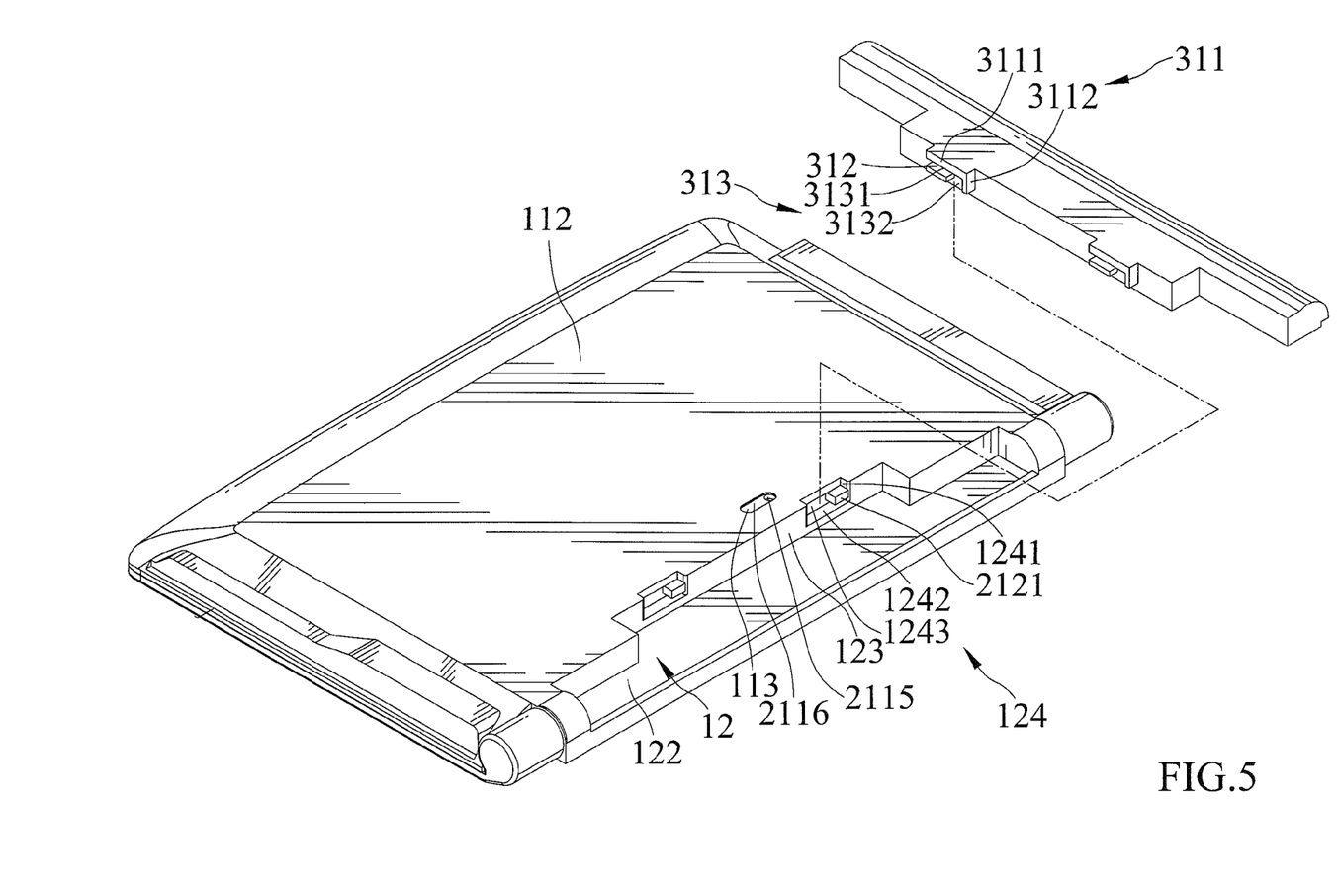
FIG. 5 is yet another exploded perspective view showing the battery disengaged from the electronic device.
Figure 6:
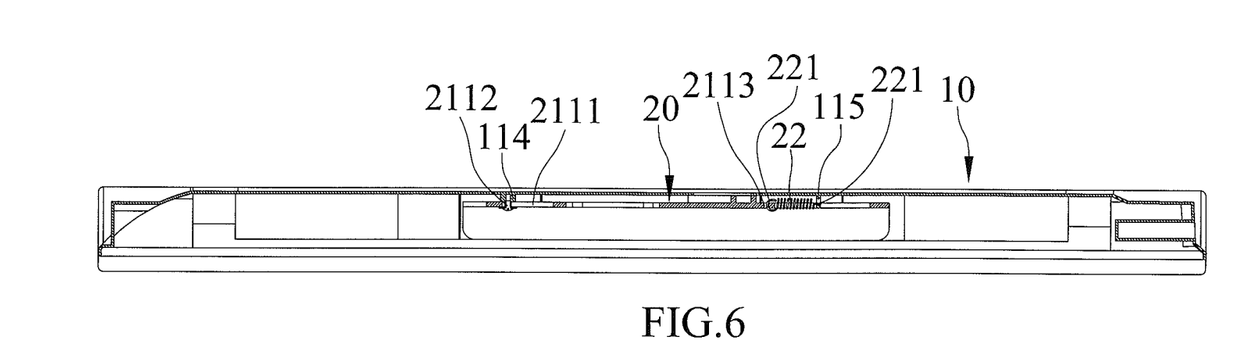
FIG. 6 is a cross-sectional view of the electronic device including the battery and the locking mechanism and shows the locking mechanism in one position.
Figure 7:
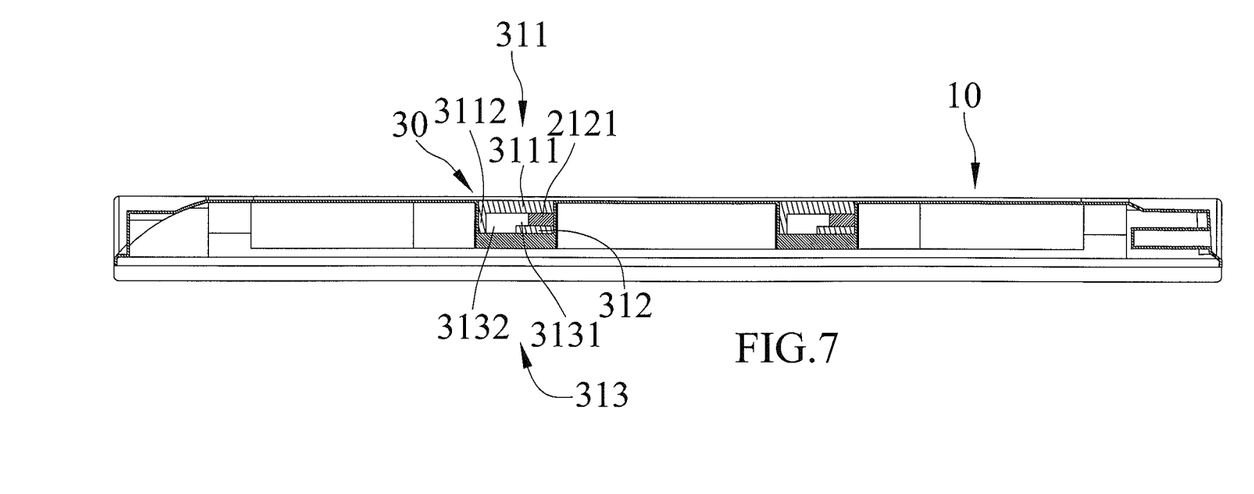
FIG. 7 is another cross-sectional view of the electronic device including the battery and the locking mechanism and shows the battery fastened to the electronic device by the locking mechanism.
Figure 8:
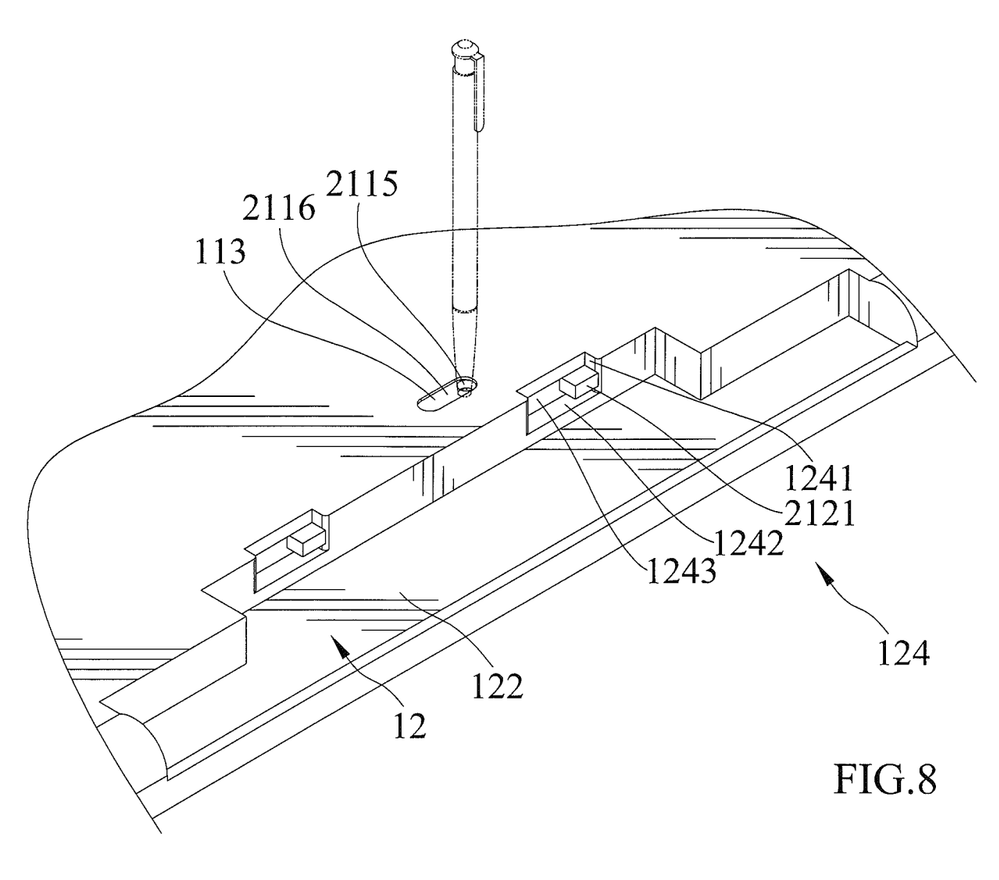
FIG. 8 is a fragmental, perspective view of the electronic device including the battery and the locking mechanism and shows an actuating member used for causing the operation of the locking mechanism, with the actuating member shown in phantom.
Figure 9:
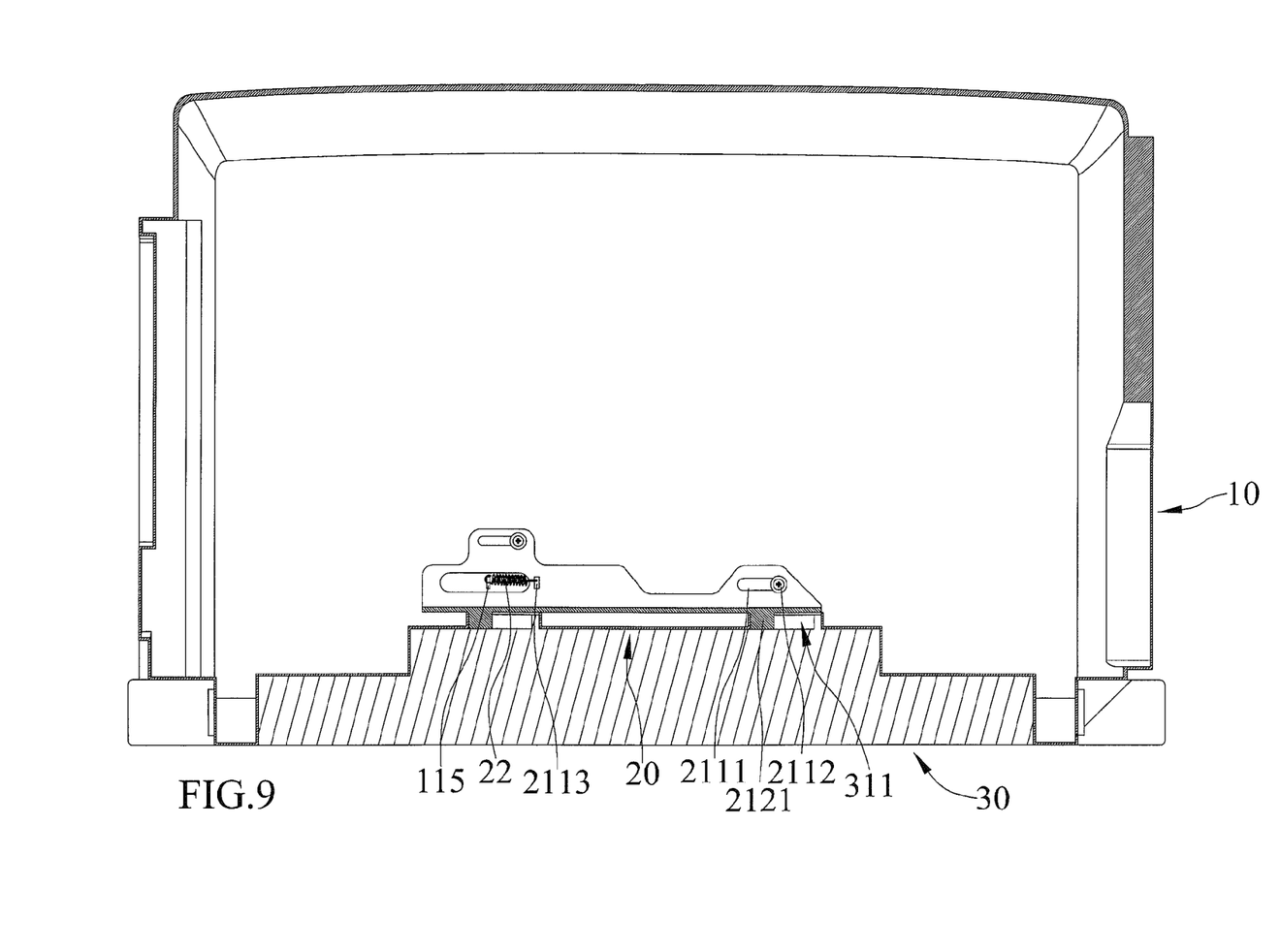
FIG. 9 is a fragmental, cross-sectional view of the electronic device including the battery and the locking mechanism and shows the battery fastened to the electronic device by the battery locking mechanism as well as the locking mechanism in a first operating position.
Figure 10:
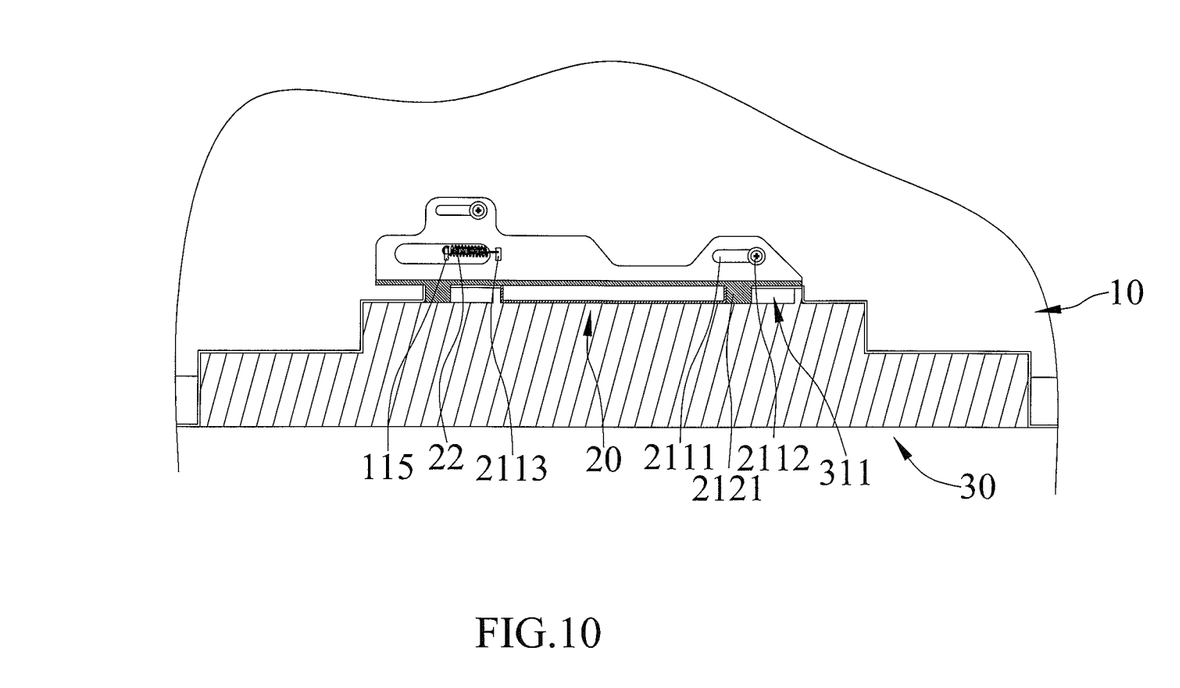
FIG. 10 is a partial enlarged view of FIG. 9.
Figure 11:
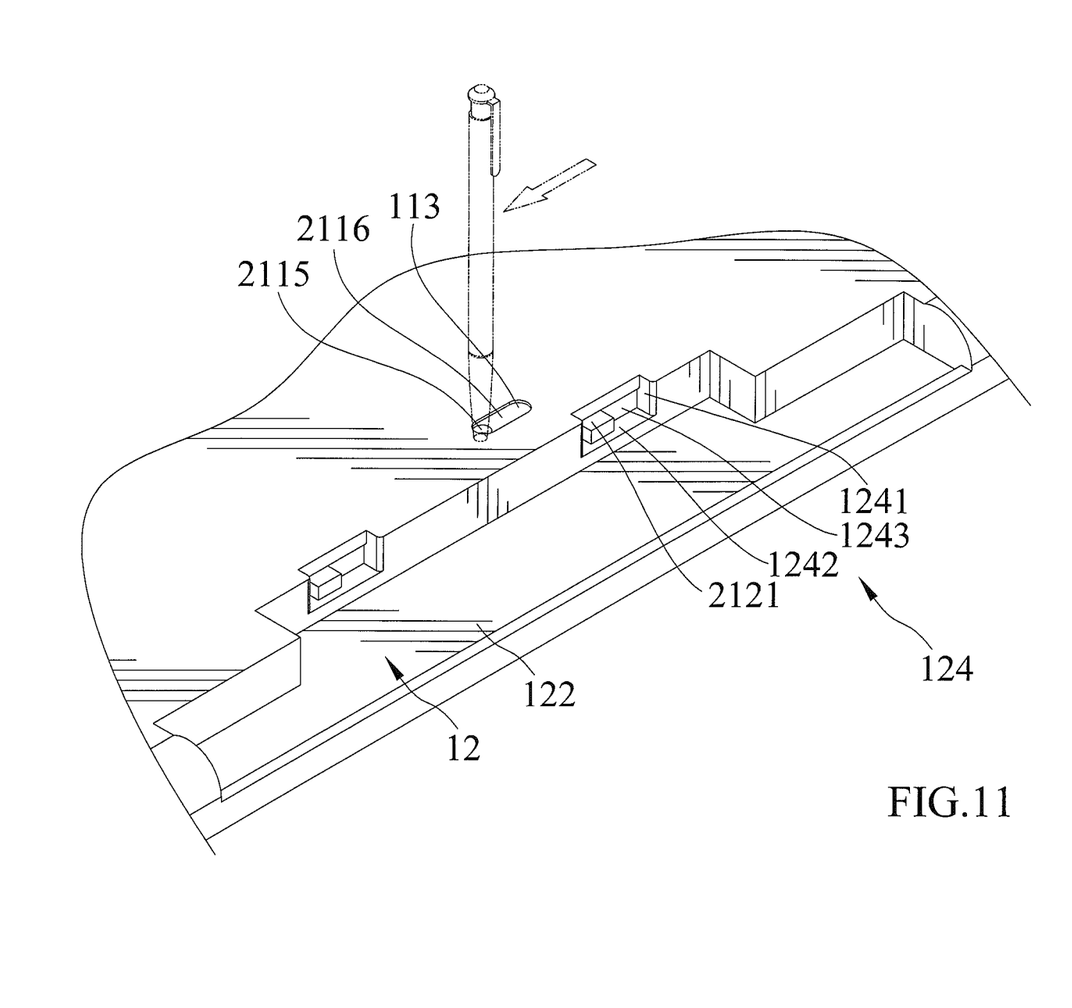
FIG. 11 is another fragmental, perspective view of the electronic device including the battery and the locking mechanism and shows the locking mechanism operated to a position different than that shown in FIG. 8.
Figure 12:
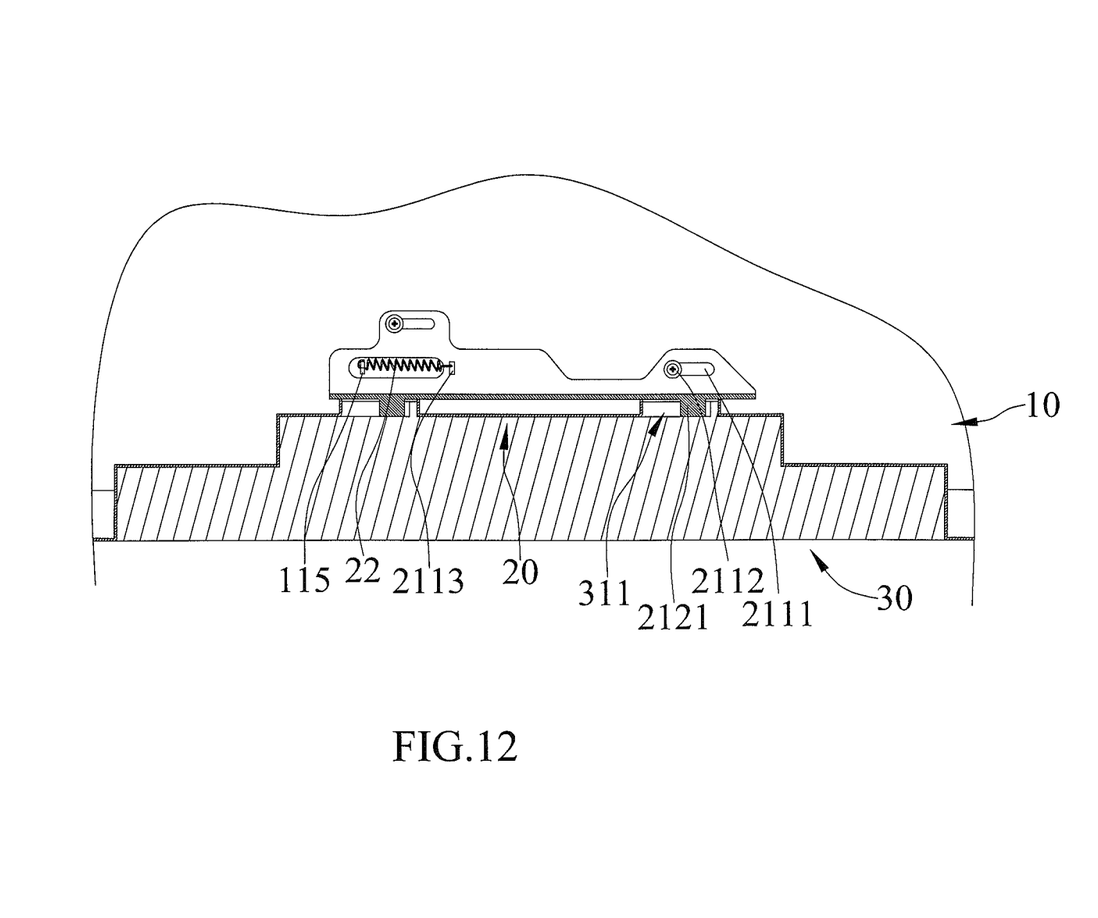
FIG. 12 is a fragmental, cross-sectional view of the electronic device including the battery and the locking mechanism similar to FIG. 10 but shows the locking mechanism in a second operating position and the battery adapted to be disengaged from the electronic device thereafter.
Figure 13:
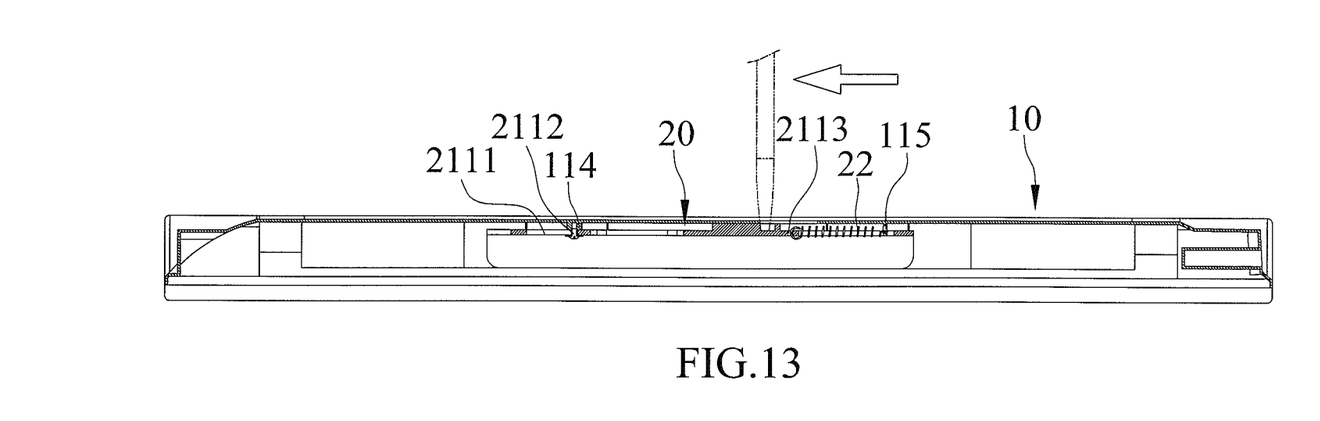
FIG. 13 is an extended cross-sectional view of FIG. 6, with the battery locking mechanism in the second operating position.
Figure 14:
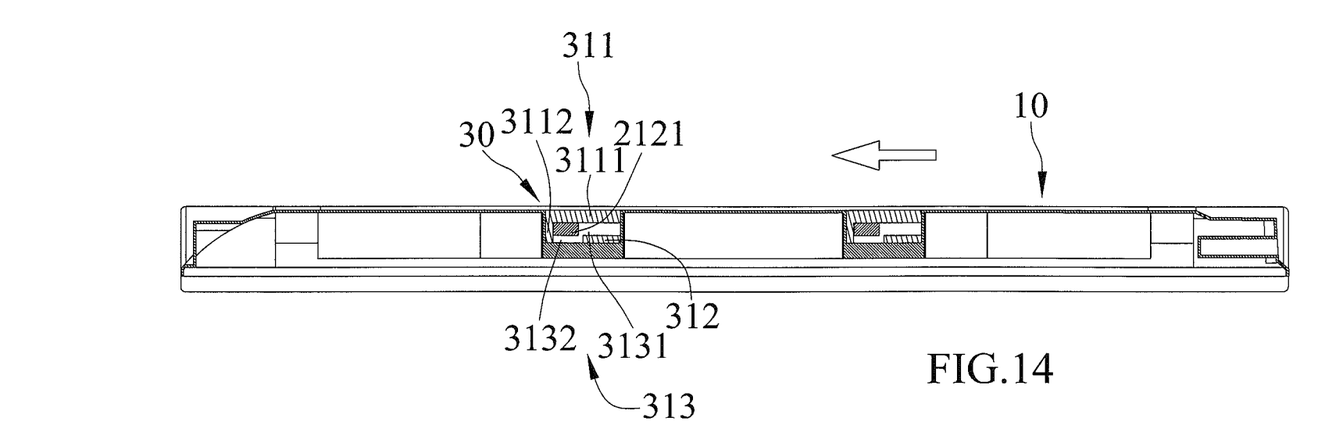
FIG. 14 is an extended cross-sectional view of FIG. 7, with the battery locking mechanism in the second operating position.
Figure 15:
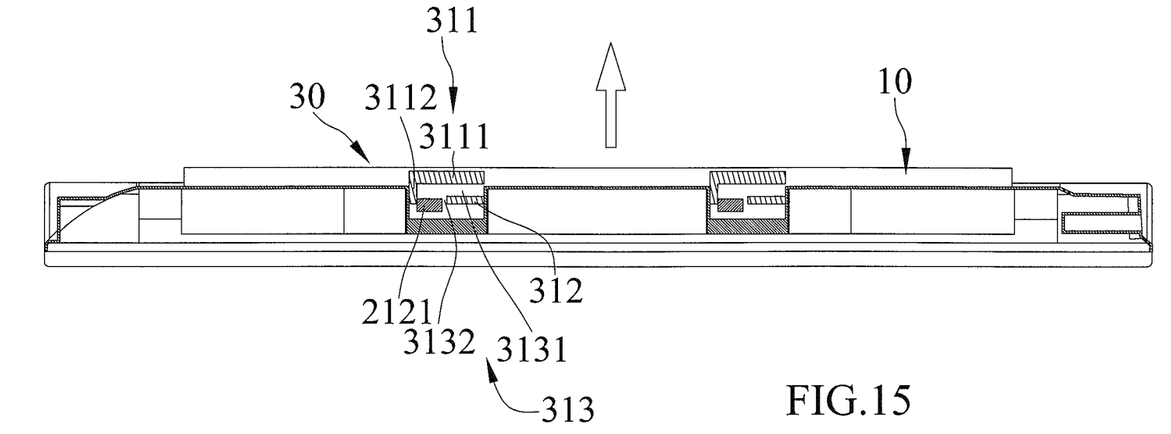
FIG. 15 is an extended cross-sectional view of FIG. 14 and shows the operation of removing the battery from the electronic device.

As set forth, the battery 30 is received in the battery bay 12 and is restrained therein by the locking mechanism 20. Namely, the battery 30 includes two connecting ends 31 defined thereon for engaging with the two clutching ends 2121, respectively. Each connecting end 31 includes first and second limiting edges 311 and 312 protruding from a surface of the battery 30 that faces the connecting edge 123 of the battery bay 12, and a channel 313 delimited by the first and second limiting edges 311 and 312. The first limiting edge 311 has a shape of a L which includes a first extension 3111 and a second extension 3112 extending transverse to the first extension 3111 while the second limiting edge 312 is I shaped and extends longitudinally in a direction parallel to the first extension 3111. The channel 313 includes a first section 3131 extending longitudinally in a direction parallel to either the first extension 3111 and the second limiting edge 312 and spacing them. The channel 313 further includes a second section 3132 extending longitudinally in a direction parallel to the second extension 3112. In addition, each clutching end 2121 is movable in the channel 313 of the related connecting end 31 upon the operational movement of the locking mechanism 20. As shown in FIG. 7, when the battery 30 is restrained in the battery bay 12 and is fastened to the electronic device, the clutching ends 2121 are received in the first section 3131 of the channel 313 of the related connecting ends 31 individually and each is disposed between the first extension 3111 of the related first limiting edge 311 and the related second limiting edge 312, whereby the battery 30 can not be disengaged from the electronic device. Likewise, when the battery 30 is to be disengaged from the electronic device, an actuating member with an end which is adapted to be inserted through the through slot 113 for engagement with the operation portion 2115 is utilized to cause the locking mechanism 20 to move from the first operating position to the second operating position thereof. As shown in FIGS. 8 and 11, the actuating member is a pen, which is an instrument that is easily acquired. So when the locking mechanism 20 is moved from the first operating position to the second operating position thereof, the locking member 21 is moved to a position such that the clutching ends 2121 are moved towards the second extension 3112 of the first limiting edge 311 of the related connecting ends 31 individually until each is disengaged from the related second limiting edge 312, as best shown in FIG. 14. The battery 30 is then adapted to be lifted off the battery bay 12 because the clutching ends 2121 are adapted to disengage the respective connecting ends 31 of the battery 30 through the second section 3132 of the related channel 313, which has a width greater than a cross-sectional size of the related clutching end 2121 so as to allow the clutching end 2121 to pass therethrough, as shown in FIG. 15. In addition, when the locking mechanism 20 is in the second operating position, the elastic element 22 is stretched. On the contrary, when a force that counteracts the elastic element 22 to operate the locking mechanism 20 to the second operating position thereof is removed, the locking mechanism 20 is automatically moved to the first operating position thereof via resilient force of the elastic element 22 in that the elastic element 22 is released from tension.

Furthermore, the display housing 40 is pivotally connected to the base 10, namely, the display housing 40 is pivotal towards or away from the base 10 selectively.

In view of the forgoing, the locking mechanism 20 will not suffer a problem of being activated inadvertently in that it is disposed within the receiving bay 11 of the base 10. Additionally, the operation of the locking mechanism 20 is easy in that user thereof just operates the operation portion 2115 of the locking member 21 to cause the locking mechanism 20 to move from the first operating position to the second operating position thereof Furthermore, the locking mechanism 20 is adapted to return from the second operating position to the first operating position thereof automatically under resilient force of the elastic element 22.

While the specific embodiment has been illustrated and described, numerous modifications come to mind without significantly departing from the spirit of invention and the scope of invention is only limited by the scope of accompanying claims.

What is claimed is:

1. An electronic device including a battery and a locking mechanism, comprising: a base including a receiving bay and a battery bay, with the receiving bay including a first inner periphery, a first outer periphery and a through slot extending from the first inner periphery to the first outer periphery, with the battery bay including a periphery defining a second inner periphery and a second outer periphery, with the second inner and outer peripheries extending from the first inner and outer peripheries respectively, with the battery bay further including a connecting edge defined from the periphery thereof, with the connecting edge including a joining end defined thereon;

a locking mechanism including a locking member and an elastic element received in the receiving bay, with the locking member being movable and including a clutching end defined thereon and extending through the joining end into the battery bay, with the elastic element including one of two distal ends joined to the receiving bay and the other distal end joined to the locking member, with the locking member further including an operation portion defined thereon for a user to operate the locking mechanism, with the operation portion located within the receiving bay and exposed to outside of the through slot of the receiving bay;

a battery receivable and selectively restrained in the battery bay by the locking mechanism and including a connecting end defined thereon for engaging with the clutching end; and wherein the locking mechanism is operably movable between a first operating position to fasten the battery to the electronic device and a second operating position where the battery is adapted to be disengaged from the electronic device, with the connecting end of the battery restrained by the clutching end of the locking member when the locking mechanism is in the first operating position, with the locking member moved to a position such that the connecting end of the battery is unrestrained by the clutching end of the locking member in order to be lifted off the battery bay when the locking mechanism is in the second operating position.

2. The electronic device including the battery and the locking mechanism as claimed in claim 1, wherein the connecting end of the battery includes first and second limiting edges protruding from a surface of the battery that faces the connecting edge of the battery bay, and a channel delimited by the first and second limiting edges.

3. The electronic device including the battery and the locking mechanism as claimed in claim 2, wherein the first limiting edge has a shape of a L which includes a first extension and a second extension extending transverse to the first extension, and the second limiting edge is I shaped and extends longitudinally in a direction parallel to the first extension, and the channel includes a first section extending longitudinally in a direction parallel to the first extension and the second limiting edge and spacing the first extension and the second limiting edge, and the channel further includes a second section extending longitudinally in a direction parallel to the second extension.

4. The electronic device including the battery and the locking mechanism as claimed in claim 3, wherein the clutching end of the locking member is movable in the channel of the connecting end upon the operational movement of the locking mechanism.

5. The electronic device including the battery and the locking mechanism as claimed in claim 4, wherein the clutching end is received in the first section of the channel of the connecting end and is disposed between the first extension of the first limiting edge and the second limiting edge when the locking mechanism is in the first operating position.

6. The electronic device including the battery and the locking mechanism as claimed in claim 1, wherein the operation portion of the locking member is engaged by an actuating member that cause the locking mechanism to move from the first operating position to the second operating position thereof, with the actuating member including an end adapted to be inserted through the through slot for engagement with the operation portion.

7. The electronic device including the battery and the locking mechanism as claimed in claim 4, wherein the locking member is moved to a position such that the clutching end is moved towards the second extension of the first limiting edge of the connecting end until the clutching end is disengaged from the related second limiting edge when the locking mechanism is in the second operating position.

8. The electronic device including the battery and the locking mechanism as claimed in claim 4, wherein the second section of the channel has a width greater than a cross-sectional size of the clutching end so as to allow the clutching end to pass therethrough.

9. The electronic device including the battery and the locking mechanism as claimed in claim 1, wherein the elastic element is stretched when the locking mechanism is in the second operating position, and the elastic element is relieved from force that counteract against when the locking mechanism is in the first operating position, whereby the locking mechanism is automatically moved to the first operating position thereof via resilient force of the elastic element.

10. The electronic device including the battery and the locking mechanism as claimed in claim 1 further comprising a display housing pivotally connected to the base.

11. The electronic device including the battery and the locking mechanism as claimed in claim 1, wherein the receiving bay includes an opening for allowing insertion of objects that are to be disposed on the receiving bay.

12. The electronic device including the battery and the locking mechanism as claimed in claim 11, wherein the objects at least include system board, a processor, and a hard drive.

13. The electronic device including the battery and the locking mechanism as claimed in claim 1, wherein the receiving bay includes an engaging member extending from the first inner periphery, and the locking member includes a groove extending therethrough, with the engaging member disposed to insert through the groove, and a fastener including a head with a cross sectional size greater than a width of the groove is engaged with the engaging member for restraining the locking member from disengagement from the base.

14. The electronic device including the battery and the locking mechanism as claimed in claim 13, wherein the engaging member includes an inner thread formed thereon, and the fastener includes an outer thread formed thereon.

15. The electronic device including the battery and the locking mechanism as claimed in claim 1, wherein the battery bay and the battery are of complement shapes to each other, and the battery restrained in the battery bay includes an outer periphery flush with the first outer periphery of the receiving bay.

* * * * *